United States Patent [19]
Yamanaka

[11] Patent Number: 5,436,492
[45] Date of Patent: Jul. 25, 1995

[54] CHARGE-COUPLED DEVICE IMAGE SENSOR

[75] Inventor: Hideo Yamanaka, Kanagawa, Japan

[73] Assignee: Sony Corporation, Tokyo, Japan

[21] Appl. No.: 78,846

[22] Filed: Jun. 21, 1993

[30] Foreign Application Priority Data

Jun. 23, 1992 [JP] Japan ................... 4-189965
Sep. 2, 1992 [JP] Japan ................... 4-260816

[51] Int. Cl.⁶ ................... H01L 23/02; H01L 23/12
[52] U.S. Cl. ................... 257/433; 257/693;
257/696; 257/698; 257/666; 257/702; 257/704
[58] Field of Search ................... 257/432–434,
257/678, 680, 666, 690, 692, 693, 696, 698, 702, 704

[56] References Cited

U.S. PATENT DOCUMENTS

| 4,760,440 | 7/1988 | Bigler et al. | 257/680 |
| 4,814,943 | 3/1989 | Okuaki | 257/787 |
| 5,070,041 | 12/1991 | Katayama et al. | 257/702 |
| 5,117,279 | 5/1992 | Karpman | 257/702 |

FOREIGN PATENT DOCUMENTS

| 58-07887 | 1/1983 | Japan | 257/704 |
| 62-37950 | 2/1987 | Japan | 257/704 |

*Primary Examiner*—Gene M. Munson
*Attorney, Agent, or Firm*—Hill, Steadman & Simpson

[57] ABSTRACT

A charge-coupled device image sensor has a base of resin having a mount area on an upper surface with a charge-coupled device chip being connected to the mount area, leads mounted on the base and connected to the charge-coupled device chip through bonding wires, and a cover of resin joined to the upper surface of the base and having a downwardly open recess housing the charge-coupled device chip and the bonding wires. The leads include respective inner leads having respective joints connected to the bonding wires, the inner leads having portions, except the joints, embedded in the base, and respective outer leads extending from the inner leads.

8 Claims, 12 Drawing Sheets

CHARGE-COUPLED DEVICE IMAGE SENSOR

BACKGROUND OF THE INVENTION

1. Field of the Invention

The present invention relates to a charge-coupled device (hereinafter referred to as "CCD") image sensor having a CCD chip sealed in a hollow package of resin, and a method of manufacturing such a CCD image sensor.

1. Description of the Related Art

Some CCD image sensors include a hollow package having a hollow space defined therein which is sealed with a certain gas. A CCD chip is hermetically disposed in the gas-filled hollow space in the hollow package. The CCD image sensor of such a structure is highly reliable in operation.

The CCD image sensor is designed for use in a video camera, a copying machine, or the like. In such an application, the CCD chip housed in the hollow package converts light applied thereto into an electric signal.

The CCD image sensor includes a base on which the CCD chip is mounted, and a cover attached to the base, the cover being made of a material of high light transmittance.

One conventional CCD image sensor with such a hollow package will be described below with reference to FIG. 1 of the accompanying drawings.

Figure 1:
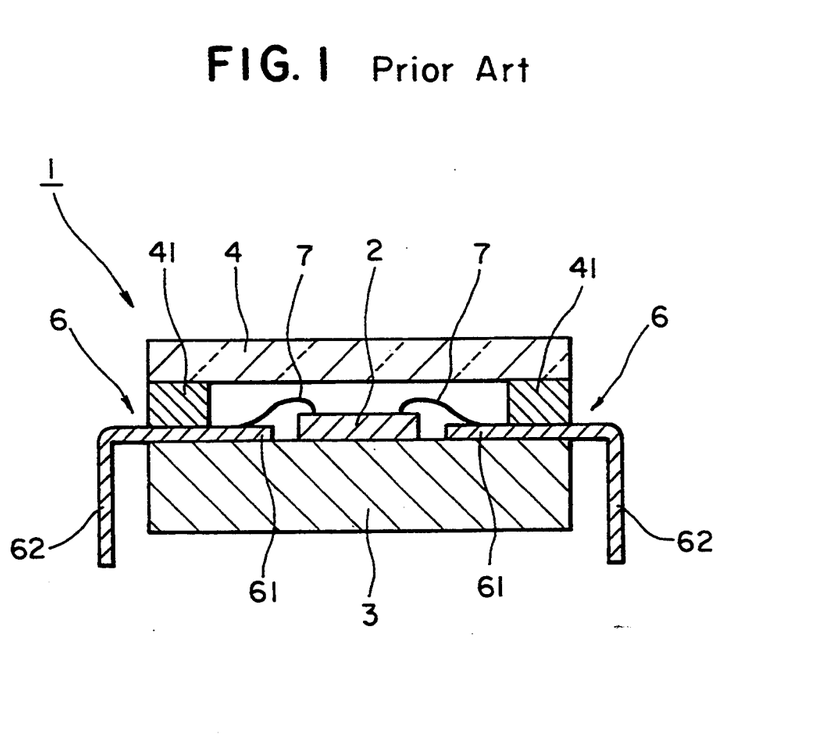
FIG. 1 is a cross sectional view of a conventional CCD image sensor with a hollow package.

As shown in FIG. 1, the CCD image sensor, generally indicated by 1, comprises a base 3 made of ceramics or the like, a CCD chip 2 mounted substantially centrally on an upper surface of the base 3, and a cover 4 disposed over the CCD chip 2, the cover 4 being made of glass of high light transmittance. Leads 6 are positioned around the CCD chip 2 on the upper surface of the base 3. The cover 4 is mounted on the base 3 through a frame 41 disposed on the leads 6. The frame 41 defines a space between the cover 4 and the base 3, and the CCD chip 2 is housed in the space.

The leads 6 have respective inner leads 61 extending into the space and connected to the CCD chip 2 by bonding wires 7 that are disposed in the space. The space is filled with a certain gas which protects the CCD chip 2 and the bonding wires 7 from moisture, harmful substances, or other adverse environments.

Light can pass through the glass cover 4 and reaches the CCD chip 2.

For lower cost and higher formability, some CCD image sensors have a resin package with the base 3 made of thermosetting resin and the cover 4 of thermoplastic resin.

The CCD image sensor shown in FIG. 1 is manufactured as follows:

First, the CCD chip 2 is bonded to a mount area of the base 3 by an epoxy adhesive such as cold-setting silver paste.

If the base 3 is made of ceramics, then the leads 6 are attached to the base 3 by glass of low melting point, and the frame 41 of certain height is attached to the peripheral edge of the base 3 by glass of low melting point. The leads 6 have respective outer leads 62 extending out of the package and electroplated with tin or solder for connection to external connecting terminals.

If the base 3 is made of thermosetting resin, then the leads 6 are embedded in the base 3 with only the inner leads 61 exposed from the upper surface of the base 3.

Then, the CCD chip 2 on the base 3 and the inner leads 61 of the leads 6 are connected to each other by the bonding wires 7.

Thereafter, the cover 4 is attached to the base 3 through the frame 41.

If the cover 4 is made of resin, then the cover 4 is bonded to the frame 41 by a cold-setting epoxy adhesive. If the cover 4 is made of glass, then the cover 4 is bonded to the frame 41 by a cold-setting epoxy seal material or a glass of low melting point, and after the cover 4 is bonded to the frame 41, the cover 4 is thermoset by being heated up to a predetermined temperature.

In this manner, the CCD image sensor 1 with the CCD chip 2 housed in the space between the base 3 and the cover 4 is manufactured.

The CCD image sensor 1 with the hollow package and its manufacturing method have the following drawbacks:

When the leads 6 are attached to the base 3, they are heated to about 400° C. to melt the glass of low melting point. Therefore, if the leads 6 are electroplated with tin, solder, or the like, then these electroplated layers are also melted.

Since an oxide film is formed on the leads 6 when they are heated, the oxide film must be removed with hot sulfuric acid or the like before the leads 6 are electroplated. Those portions which are not required to be treated for oxide film removal and the applied sulfuric acid must be washed off. These extra steps increase the total number of steps of the manufacturing process.

One solution to the above problems would be to use a resin seal material capable of connecting the base 3 and the leads 6 at such a temperature that the solder or the like will not be melted. The resin seal material is however detrimental to the hermetic property as it fails to provide sufficient intimate contact between the ceramic base 3 and the metallic leads 6.

Inasmuch as the mount area of the base 3 for supporting the CCD chip 2 is required to be highly flat, sintering conditions have to be controlled accurately when the base 3 is sintered of ceramics. However, controlling only the sintering conditions is not enough, but the sintered base 3 must be ground, to obtain a desired level of flatness of the base 3.

Because of the increased number of steps involved, it is difficult to reduce the cost of the CCD image sensor 1.

If the base 3 is made of ceramics and the cover 4 of glass, then the base 3 and the cover 4 have formability problems and the problems of dust deposits and poor quality control, resulting also in difficulty in achieving a cost reduction and a yield increase.

If the base 3 is made of thermosetting resin and the cover 4 of glass, then the base 3 can easily be formed to desired shape for reducing the side of the CCD image sensor 1. However, it is highly difficult to shape and grind the glass cover 4 into a small size.

If the base 3 is made of ceramics and the cover 4 of resin, then no adhesive is available to bond the base 3 and the cover 4 to each other with sufficient bonding strength. Lack of sufficient bonding strength results in a reduction in the hermetic property of the package.

If the base 3 is made of thermosetting resin and the cover 4 of thermoplastic resin, then they have greater formability, can be fabricated with a low cost, and allow the CCD image sensor 1 to be small in size. However, the difference between the coefficients of thermal expansion of the materials of the base 3 and the cover 4 causes the base 3 and the cover 4 to be peeled from each other when the adhesive is thermoset or due to an ambient temperature change. Accordingly, the package with the 3 of thermosetting resin and the cover 4 of thermoplastic resin is not practically feasible.

SUMMARY OF THE INVENTION

It is an object of the present invention to provide a CCD image sensor which has a hollow package that is highly accurate and can be fabricated at a low cost, and a method of manufacturing such a CCD image sensor.

According to the present invention, there is provided a charge-coupled device image sensor comprising a base of resin having a mount area on an upper surface with a charge-coupled device chip being connected to the mount area, leads mounted on the base and connected to the charge-coupled device chip through bonding wires, and a cover of resin joined to the upper surface of the base and having a downwardly open recess housing the charge-coupled device chip and the bonding wires, the leads including respective inner leads having respective joints connected to the bonding wires, the inner leads having portions, except the joints, embedded in the base, and respective outer leads extending from the inner leads.

The mount area may be of a convex shape higher than the upper surface of the base or a concave shape lower than the upper surface of the base.

The base may have a thickness below the mount area which is smaller than the thickness of the remainder of the base.

The charge-coupled device image sensor may further include a metallic die pad mounted on the mount area. The base may have a thickness below the die pad which is smaller than the thickness of the remainder of the base. The base may have a heat-radiating hole defined therein below the die pad and exposing a reverse side of the die pad.

The base may have a joint surface connected to the cover, the joint surface being lower than the upper surface of the remainder of the base.

The outer leads may be disposed over a reverse side of the base.

The outer leads may extend out of a side of the base and have respective distal ends bent over a reverse side of the base.

The charge-coupled device image sensor may further include a holder base for an optical lens system, the holder base being mounted on the base outside of the cover with reference to the upper surface of the base.

According to the present invention, there is also provided a method of manufacturing a charge-coupled device image sensor having a base of resin, a charge-coupled device chip mounted on an upper surface of the base, and a cover of resin having a frame of predetermined height mounted on the base in covering relationship to the charge-coupled device chip, the method comprising the steps of molding a base of thermoplastic resin with a lead frame embedded therein and having inner leads exposed on an upper surface of the base, placing a charge-coupled device chip on the base, connecting the inner leads to the charge-coupled device chip with bonding wires, and joining a frame of a cover of thermoplastic resin to a peripheral edge of the base either ultrasonically, or by a laser beam, or by an ultraviolet-curing adhesive.

According to the present invention, there is further provided a method of manufacturing a charge-coupled device image sensor having a base of resin, a charge-coupled device chip mounted on an upper surface of the base, and a cover of resin having a frame of predetermined height mounted on the base in covering relationship to the charge-coupled device chip, the method comprising the steps of molding a base of thermosetting resin with a lead frame embedded therein and having inner leads exposed on an upper surface of the base, placing a charge-coupled device chip on the base, connecting the inner leads to the charge-coupled device chip with bonding wires, and joining a frame of a cover of thermosetting resin to a peripheral edge of the base with an ultraviolet-curing adhesive.

Since the base is made of a resin material, the upper surface of the base may be made flat easily with high accuracy.

Since the inner leads, except their joints, are embedded in the resin base, the base and the cover may be joined to each other through flat joint surfaces.

Therefore, the base and the cover may be held in intimate contact with each other, hermetically sealing a space defined between the base and the cover.

If the mount area for supporting the charge-coupled device chip thereon is of a convex shape, then the charge-coupled device chip can easily be positioned with respect to the mount area.

If the mount area for supporting the charge-coupled device chip thereon is of a concave shape, then as the charge-coupled device chip is snugly fitted in the mount area, dust particles or foreign matter attached to sides of the charge-coupled device chip can be trapped and sealed in an adhesive.

The portion of the base below the mount area may be thinner than the other portion thereof to allow heat generated by the charge-coupled device chip to be radiated out easily.

With the metallic die pad on the mount area, the base may be made thinner below the die pad or may have a heat-radiating hole exposing the reverse side of the die pad to allow heat generated by the charge-coupled device chip to be radiated out easily through the die pad.

Inasmuch as the portion of the upper surface of the base which is held in contact with the cover may be lower than the other upper surface of the base, the cover may easily be positioned with respect to the base, and any adhesive applied between the cover and the base may be prevented from being forced out of a hollow package which is composed of the base and the cover.

The outer leads may be disposed on the reverse side of the base or may be bent over the reverse side of the base. This arrangement allows the charge-coupled device image sensor to be surface-mounted on a printed-wiring board or the like.

The holder base for an optical lens system, which is disposed outside of the cover with reference to the upper surface of the base, permits the charge-coupled device chip and the optical lens system to be positioned accurately with respect to each other.

According to the method of manufacturing a charge-coupled device image sensor, since the base and the cover is made of either thermoplastic resin or thermosetting resin, the difference between the coefficients of thermal expansion of the base and the cover is so small that any stress applied to the joint surfaces between the base and the cover due to temperature changes is minimized.

If the base and the cover are made of thermoplastic resin, then the base and the cover may be fused to each other without being heated, by ultrasonic energy or a laser beam that is applied to the peripheral edge of the base and the frame of the cover.

If the base and the cover are made of either thermosetting resin or thermoplastic resin, then the surfaces of the base and the cover which are to be held in contact with each other may coated with an ultraviolet-curing adhesive, and then ultraviolet radiation of certain wavelength may be applied to the ultraviolet-curing adhesive to bond the base and the cover without heating them in their entirety.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 2:
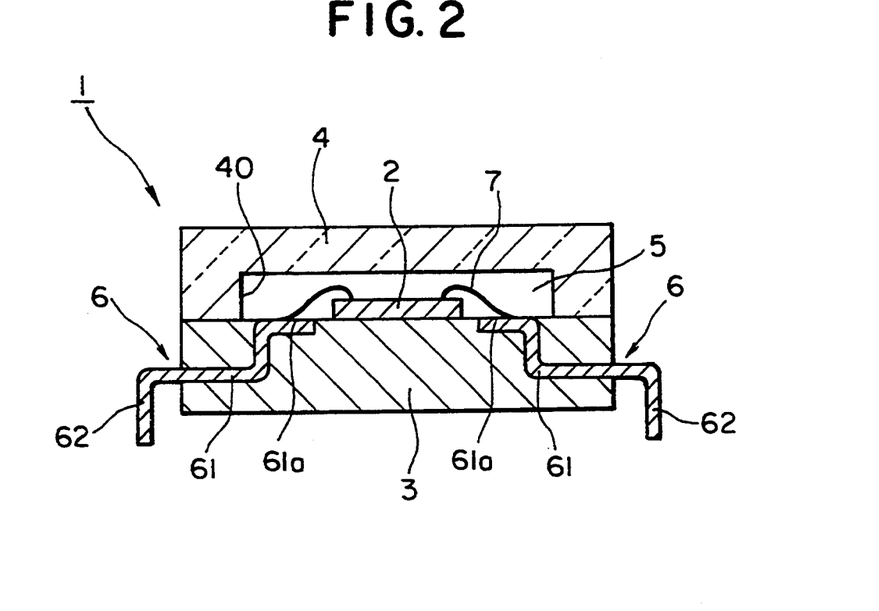
FIG. 2 is a cross-sectional view of a CCD image sensor with a hollow package according to the present invention.

AS shown in FIG. 2, a CCD image sensor, generally indicated by 1, according to the present invention comprises a hollow package composed of a base 3 of resin and a cover 4 of resin mounted on an upper surface of the base 3, the base 3 and the cover 4 jointly defining a space 5 therebetween.

The CCD image sensor 1 also includes a CCD chip 2 mounted substantially centrally on the base 3 and a plurality of leads 6 supported by the base 3 around the CCD chip 2. The cover 4 has a recess 40 defined in its lower portion in surrounding relationship to the CCD chip 2. The recess 40 serves as the space 5 over the base 3.

The leads 6 have respective inner leads 61 with respective joints 61a disposed on the upper surface of the base 3 in the recess 40, i.e., the space 5. The CCD chip 2 is connected to the joints 61a through bonding wires 7.

The other portions of the inner leads 61 than the joints 61a are bent downwardly and embedded in the base 3. The leads 6 also have respective outer leads 62 extending from the respective inner leads 61 out of opposite sides of the base 3. Therefore, the inner leads 61 are not sandwiched between the base 3 and the cover 4, allowing the base 3 and the cover 4 to be joined together through flat surfaces.

The CCD image sensor 1 is manufactured as follows:

The base 3 and the cover 4 may be made of thermoplastic resin or thermosetting resin. At any rate, a lead frame 10 (see FIG. 3) from which a single lead or a plurality of leads can be produced is employed in the manufacture of the CCD image sensor 4.

Figure 3:
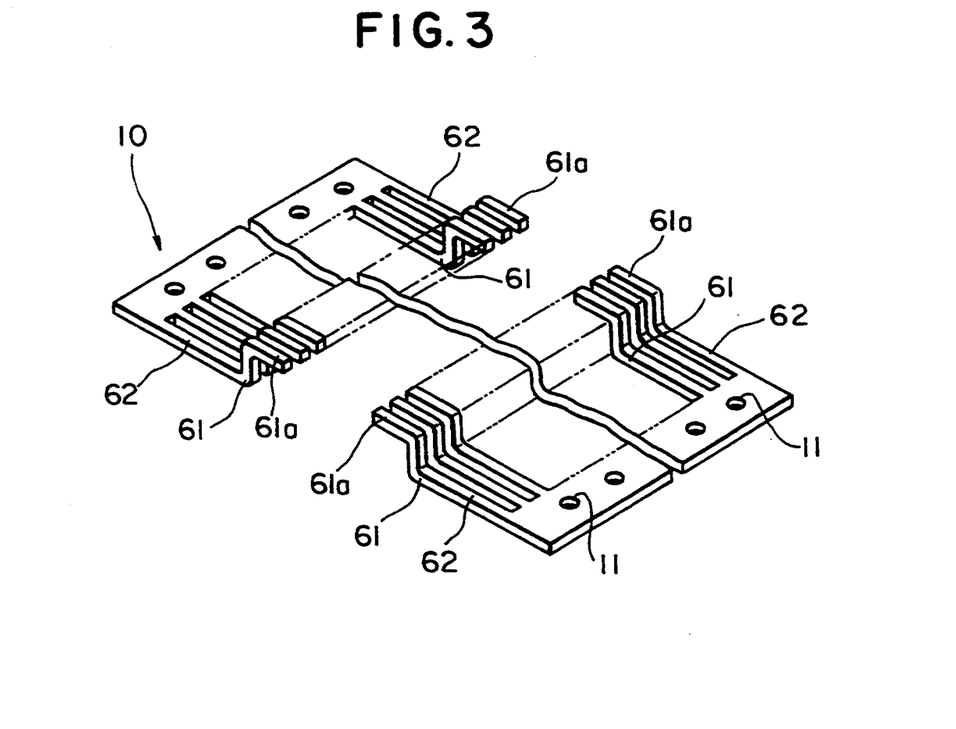
FIG. 3 is a perspective view of a lead frame.

The lead frame 10 comprises an elongate frame of 42 alloy or copper with sprocket holes 11 defined in opposite longitudinal edges thereof, the frame including a plurality of leads 6 having inner and outer leads 61, 62. The frame is bent into a crank shape at the inner leads 61 as by pressing. The inner and outer leads 61, 62 are electroplated with tin, solder, or the like in advance. The joints 61a of the inner leads 61 are clad with an aluminum layer on the lead frame material or plated layer for facilitating connection to bonding wires.

A process of manufacturing the CCD image sensor 1 using the lead frame 10 will be described below with reference to FIGS. 4 through 6.

Figure 4:
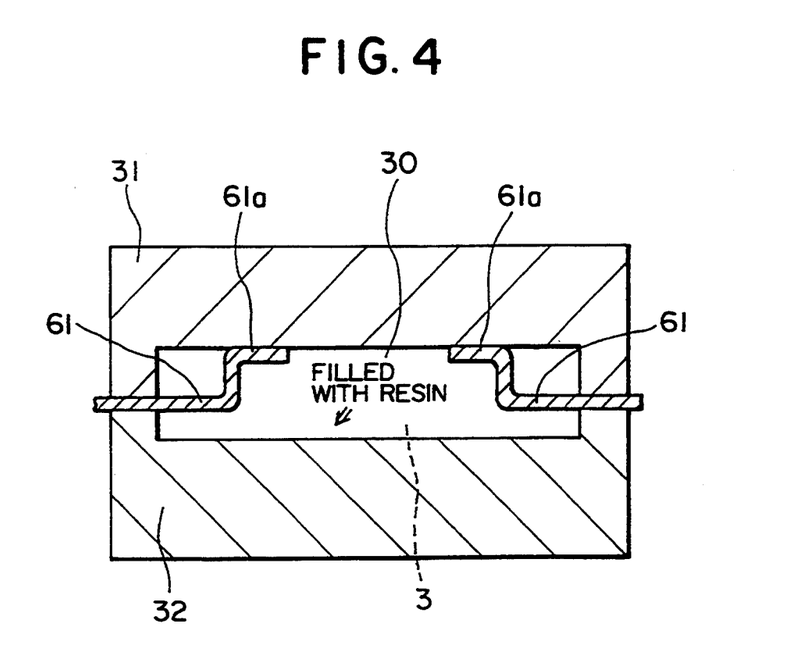
FIG. 4 is a cross-sectional view illustrating the manner in which a base is formed.

First, the base 3 is molded as shown in FIG. 4. The lead frame 10 is placed between upper and lower molds 31, 32 which jointly define a cavity 30 therebetween. The inner leads 61 of the leads 6 are disposed in the cavity 30 with the joints 61a held against an inner surface of the upper mold 31. The vertical dimension of the inner leads 61 may be slightly greater than the height of the cavity portion in the upper bold 31 to keep the joints 61a in reliable contact with the upper mold 31.

Then, a resin material is filled in the cavity 30 to mold the base 3 therein. If the base 3 is to be made of thermoplastic resin, then the cavity 30 may be filled with polyolefin, norbornene, polycarbonate, or acrylic resin with an additive for increasing intimate contact with the lead frame 10 and a filler for increasing heat resistance and mechanical strength of the base 3.

Now, the base 3 with the inner leads 61 embedded therein and the upper surfaces of the joints 61a exposed on its upper surface is molded in the cavity 30.

The upper surface of the resin base 3 is the mirror image of the inner surface of the cavity 30 in the upper mold 31. Therefore, if the inner surface of the cavity 30 in the upper mold 31 is flat with no curved areas, then the upper surface of the base 3 is made flat.

Thereafter, any resin burrs are removed from the joints 61a of the inner leads 61 and the peripheral surfaces of the base 3 by ultra-high water pressure.

Figure 5:
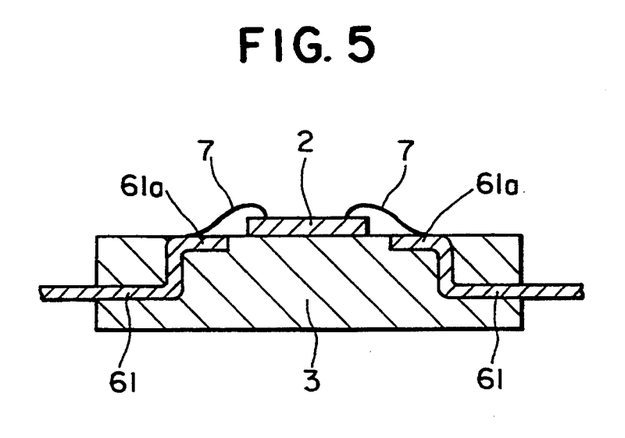
FIG. 5 is a cross-sectional view illustrating the manner in which a CCD chip is mounted on the base.

Then, the CCD chip 2 is bonded to the upper surface of the base 3 as shown in FIG. 5.

More specifically, the CCD chip 2 is bonded to the base 3 by a cold-setting adhesive or an ultraviolet-curing adhesive, so that any heat-induced deformations of the base 3 will be minimized.

The CCD chip 2 is connected to the upper surfaces of the joints 61a which lie substantially flush with the upper surface of the base 3, by bonding wires 7.

The bonding wires 7 may comprise cold wires whose diameter ranges from 25 to 30 μm for bold ball bonding or aluminum wires for aluminum wedge bonding at normal temperature.

The bonding wires 7 should preferably be low-arch-type wires to prevent themselves from flaring and also from deformation and breakage upon subsequent ultrasonic fusion.

Figure 6:
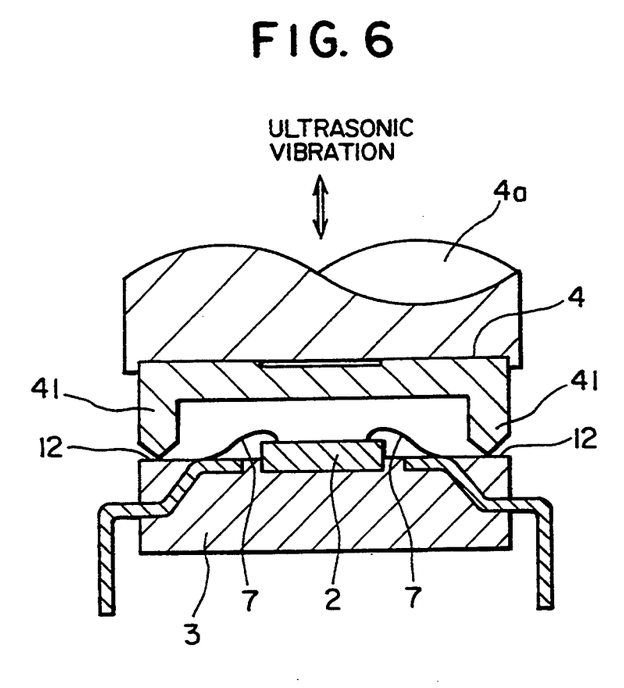
FIG. 6 is a cross-sectional view illustrating the manner in which a cover is fused to the base.

The resin cover 4 is then joined to the upper surface of the base 3 as shown in FIG. 6.

If the cover 4 is made of thermoplastic resin, then the cover 4 is placed on the base 3, and thereafter they are fused together with ultrasonic energy, thus fabricating the CCD image sensor 1 with the CCD chip 2 housed in the space between the base 3 and the cover 4.

The cover 4 of the CCD image sensor 1 should be made of a material of high light transmittance.

The cover 4 includes a downwardly projecting frame 41 having a height that is greater than the height of the bonding wires 7.

To fuse the base 3 and the cover 4, the cover 4 is first placed on the base 3 such that the frame 41 contacts peripheral edges 12 of the base 3. Then, a vibrator 4a of an ultrasonic fusing device is pressed against the upper surface of the cover 4. Thereafter, vertical vibration is applied to the vibrator 4a at a frequency of 28 kHz for about one second, or for 0.5 to several seconds, to ultrasonically fuse the frame 41 and the peripheral edges 12 to each other.

For efficient ultrasonic fusion between the frame 41 and the peripheral edges 12, the frame 41 may be of a triangular cross-sectional shape, for example.

Figure 7:
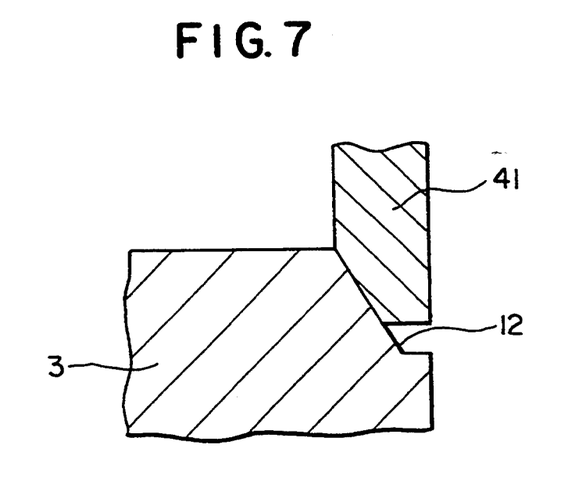
FIG. 7 is a enlarged fragmentary cross-sectional view of other joint surfaces.
Figure 8:
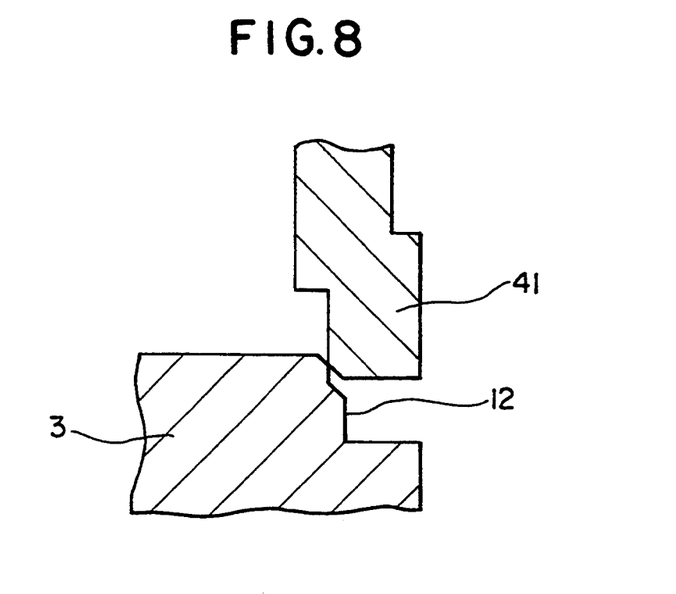
FIG. 8 is a enlarged fragmentary cross-sectional view of still other joint surfaces.
Figure 9:
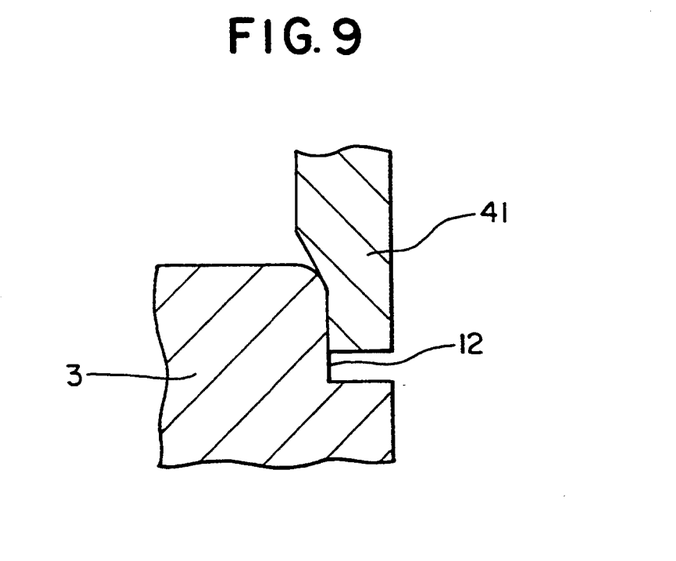
FIG. 9 is a enlarged fragmentary cross-sectional view of yet other joint surfaces.

The peripheral edges 12 of the base 3 and the frame 41 may be held in contact with each other through slant surfaces as shown in FIG. 7. As shown in FIG. 8, the peripheral edges 12 of the base 3 and the frame 41 may be held in contact with each other through surfaces lying in the direction in which they vibrate. Alternatively, as shown in FIG. 9, the peripheral edges 12 of the base 3 may have round surfaces for fusing the peripheral edges 12 and the frame 41 in shear contact with each other.

The joint surfaces of the peripheral edges 12 and the frame 41 are not limited to the above shapes, but may be of any optimum shape depending on the material of the peripheral edges 12 and the frame 41.

In any case, the base 3 and the cover 4 can be fused ultrasonically, without heat, so that the base 3 and the cover 4 are prevented from being deformed with heat.

For ultrasonic fusion, it is most preferable to construct the base 3 and the cover 4 of the same kind of thermoplastic resin.

However, different kinds of thermoplastic resin may also be ultrasonically fused to each other. For example, ultrasonic fusion may be achieved between the base 3 which is made of acrylonitrile-butadiene-styrene (ABS) resin and the cover 4 which is made of polycarbonate (PC), or between the base 3 which is made of ABS resin and the cover 4 which is made of polymethyl methacrylate (PMMA). These materials may be selected depending on the application of the CCD image sensor 1.

Figure 10:
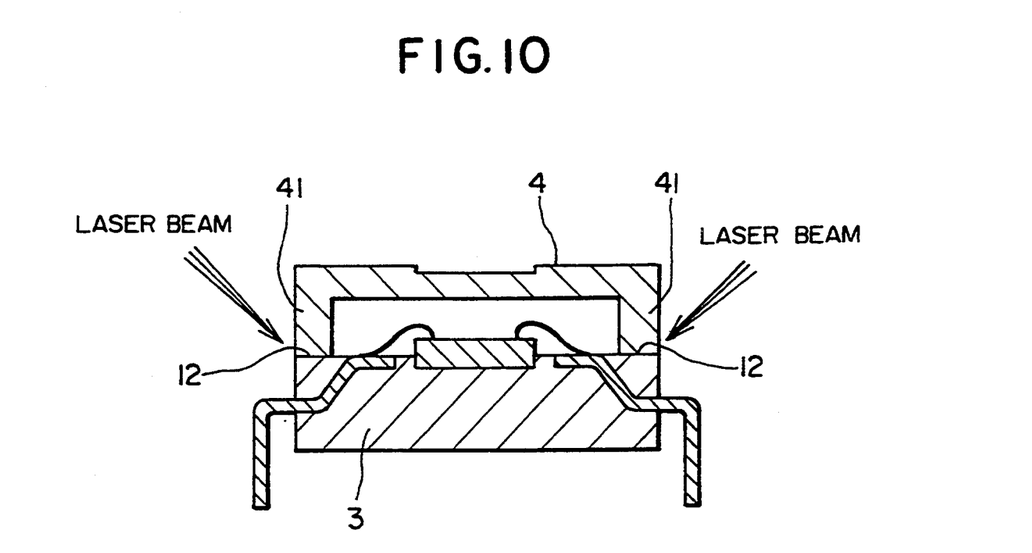
FIG. 10 is a cross-sectional view showing another manufacturing process.

Another fusion process is a laser fusion process as shown in FIG. 10.

In the laser fusion process, the peripheral edges 12 of the base 3 and the frame 41 of the cover 4 have flat joint surfaces, and a laser beam is applied to these flat joint surfaces to locally heat and fuse the joint surfaces. Since the laser fusion process is not required to heat the base 3 and the cover 4 in their entirety, the base 3 and the cover 4 are prevented from being deformed with heat.

The surfaces to be fused are not limited to the shape shown in FIG. 10, but may be of an optimum shape depending on the material of the peripheral edges 12 and the frame 41.

Figure 11:
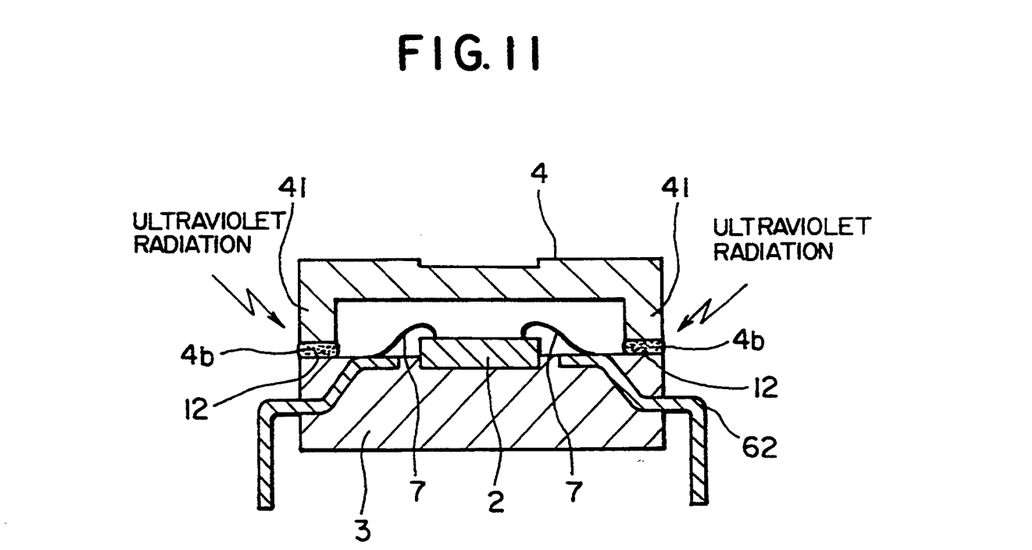
FIG. 11 is a cross-sectional view showing still another manufacturing process.

If the base 3 and the cover 4 are made of thermosetting epoxy resin, then, as shown in FIG. 11, the CCD chip 2 is mounted on the base 3 with the lead frame 10 embedded therein and connected to the leads 6 by the bonding wires 7, and thereafter the cover 4 is bonded to the base 3 by an ultraviolet-curing adhesive 4b. The bonding process is carried out by applying the adhesive 4b to the peripheral edges 12 of the base 3, placing the frame 41 of the cover 4 on the applied adhesive 4b, and then applying an ultraviolet radiation of predetermined wavelength to the adhesive 4b to cure the adhesive 4b.

If the base 3 and the cover 4 are made of thermoplastic resin, then they may be bonded by an ultraviolet-curing adhesive in the same process as described above.

If the base 3 and the cover 4 were made of either thermosetting resin or thermoplastic resin and bonded by a thermosetting adhesive with heat, then the base 3 and the cover 4 would tend to be deformed with heat or strained, resulting in a loss of hermetic property.

According to the above process of the present invention, since the base 3 and the cover 4 can be bonded to each other without being heated, the CCD image sensor 1 can be fabricated without heat-induced deformation or undesirable strain.

After the cover 4 has been fused to the base 3, the outer leads 62 are cut off and bent to desired shape by pressing or the like.

Instead of finally cutting off the outer leads 62 to divide the assembly into individual CCD image sensors 1, the outer leads 62 may be cut off before the CCD chip 2 is mounted, and thereafter the individual assemblies may be processed as described above.

In the process of manufacturing the CCD image sensor 1 irrespective of which material is used, the base 3 and the cover 4 are prevented from being peeled off each other due to heat-induced deformation because the difference between the coefficients of thermal expansion of the base 3 and the cover 4 is small and it is not necessary to heat the base 3 and the cover 4 in their entirety. Thus, the space between the base 3 and the cover 4 is hermetically sealed, protecting the CCD chip 2 against any adverse effects which would otherwise be caused.

Electroplated layers of tin, solder, or the like on the lead frame are prevented from being melted during the process of manufacturing the CCD image sensor 1.

Since the resin material has high formability and allows, high dimensional accuracy, the resultant package may be reduced in size and weight. If the base 3 and the cover 4 are made of thermoplastic resin, particularly, no adhesive needs to be applied as they can be fused together.

The resin materials referred to above are given by way of illustrative example only. If the base 3 and the cover 4 are to be made of thermoplastic resin, then a particular thermoplastic resin material should be selected which permits easy ultrasonic or laser fusion. If the base 3 and the cover 4 are to be made of thermosetting resin, then a particular thermosetting resin material should be selected which allows an ultraviolet-curing adhesive to exert a sufficient bonding strength.

Other CCD image sensors according to the present invention will be described below.

Figure 12:
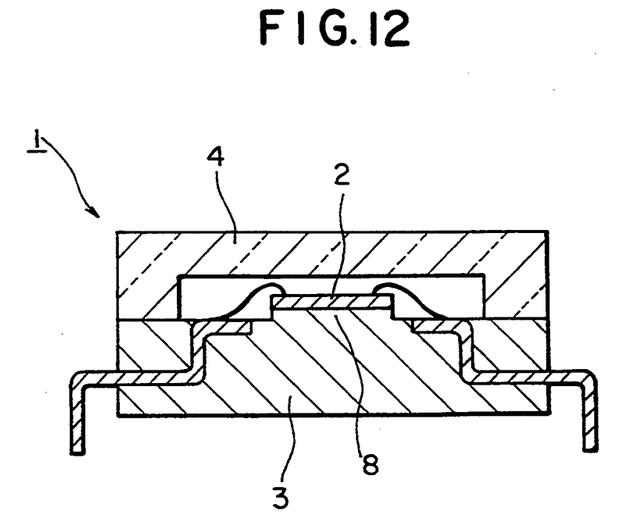
FIG. 12 is a cross-sectional view of another CCD image sensor.

FIG. 12 shows another CCD image sensor 1 having a base 3 including a mount area 8 on its upper surface for mounting a CCD chip 2 thereon, the mount area 8 being of an upwardly convex shape slightly higher than the upper surface of the base 3. The raised mount area 8 allows the CCD chip 2 to be reliably positioned when it is mounted on the mount area. 8.

Figure 13:
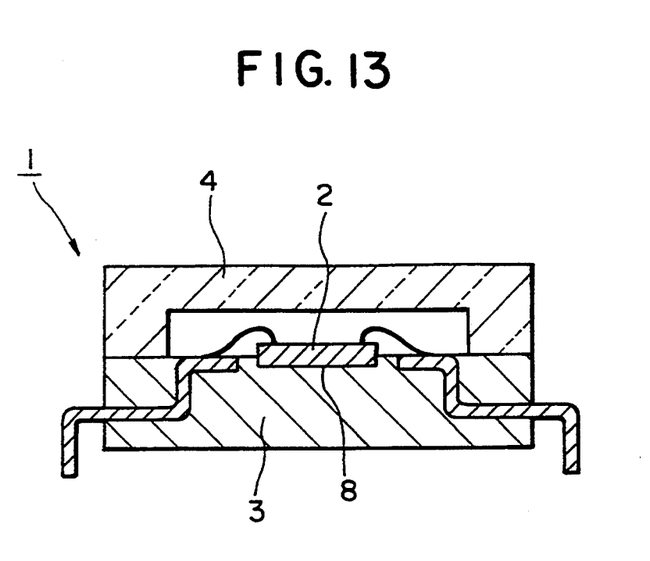
FIG. 13 is a cross-sectional view of still another CCD image sensor.

FIG. 13 illustrates still another CCD image sensor 1 having a base 3 including a mount area 8 in its upper surface for mounting a CCD chip 2 thereon, the mount area 8 being of a downwardly concave shape slightly lower than the upper surface of the base 3. When the CCD chip 2 is mounted on the mount area 8, the CCD chip 2 is partly embedded in the base 3.

When the CCD chip 2 is bonded to the base 3 by silver paste, the sides of the CCD chip 2 are covered with the applied silver paste. Usually, the sides of the CCD chip 2 are smeared with dust particles and broken pieces that are produced when the CCD chip 2 is cut out of a substantially circular wafer. With the sides of the CCD chip 2 being covered with the applied silver paste, such deposited dust particles and broken pieces are prevented from being scattered into the space 5 and hence from being deposited on the surface of the CCD chip 2.

Figure 14:
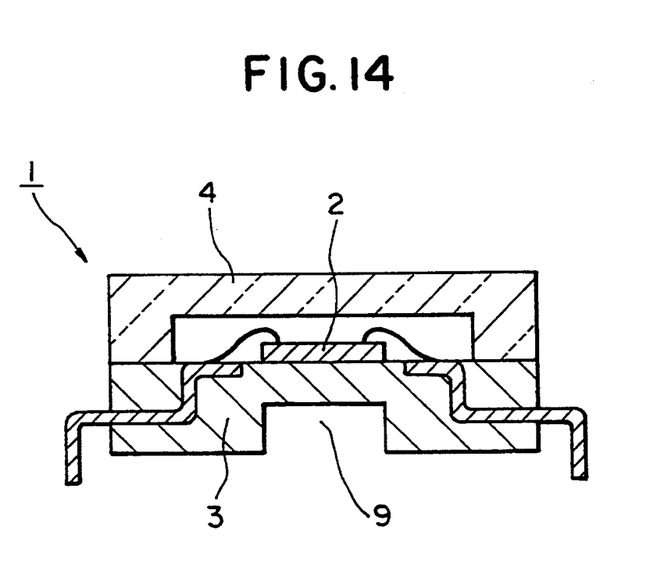
FIG. 14 is a cross-sectional view of yet another CCD image sensor.

FIG. 14 shows yet another CCD image sensor 1 having a base 3 including a heat-radiating hole 9 defined therein below the CCD chip 2 mounted on the base 3. Because of the heat-radiating hole 9, the portion of the base 3 below the CCD chip 2 is thinner than the other portion of the base 3, allowing heat generated by the CCD chip 2 to be radiated out easily. The heat radiation capability of the base 3 which is made of resin is about 30% lower than the heat radiation capability of the base 3 which is made of ceramics. If the heat-radiating hole 9 is of a size greater than an active-element region of the CCD chip 2, then the heat-radiating hole 9 is effective to compensate for the poor heat radiation, preventing the CCD chip 2 from characteristic degradations. The heat-radiating hole 9 may be formed in the base 3 by a complementary projection on the lower mold 32 (see FIG. 4) when the base 3 is molded by the upper and lower molds 31, 32.

Figure 15:
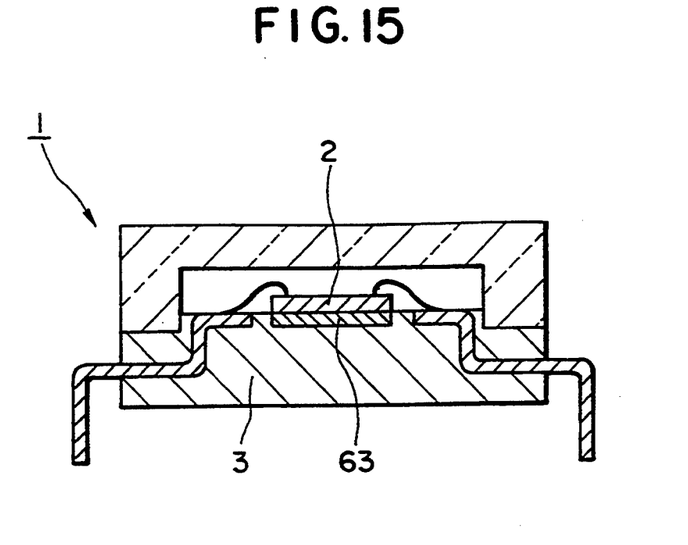
FIG. 15 is a cross-sectional view of yet still another CCD image sensor.

Yet still another CCD image sensor 1 shown in FIG. 15 has a metallic die pad 63 disposed in the mount area of a base 3 which supports the CCD chip 2. Specifically, the base 3 is combined with a lead frame 10 which includes the die pad 63. Since a ground potential may be led from the reverse side of the CCD chip 2 through the die pad 63, any ground potential variations on the CCD chip 2 may be reduced.

Figure 16:
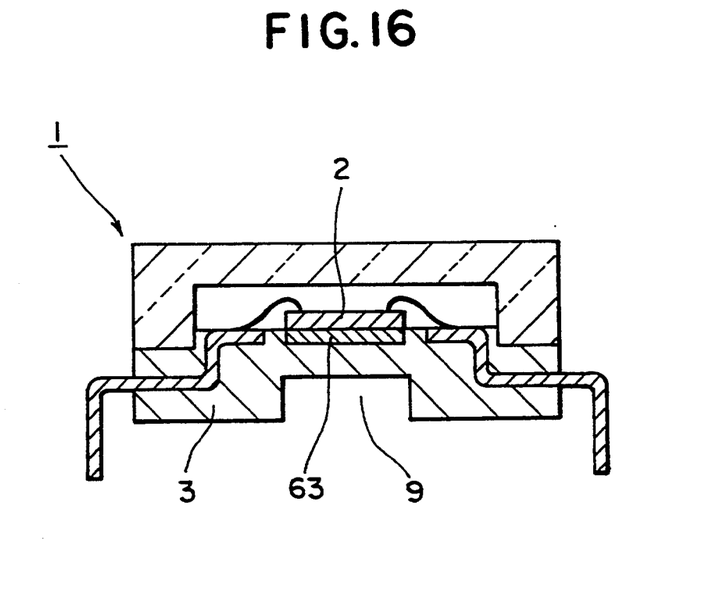
FIG. 16 is a cross-sectional view of a further CCD image sensor.

A further CCD image sensor 1 shown in FIG. 16 also has the die pad 63 in the mount area of a base 3. The portion of the base 3 below the die pad 63 is thinner than the other portion of the base 3 for allowing heat generated by the CCD chip 2 to be radiated out easily. Furthermore, any ground potential variations on the CCD chip 2 may be reduced because a ground potential may be led from the reverse side; of the CCD chip 2 through the die pad 63.

Figure 17:
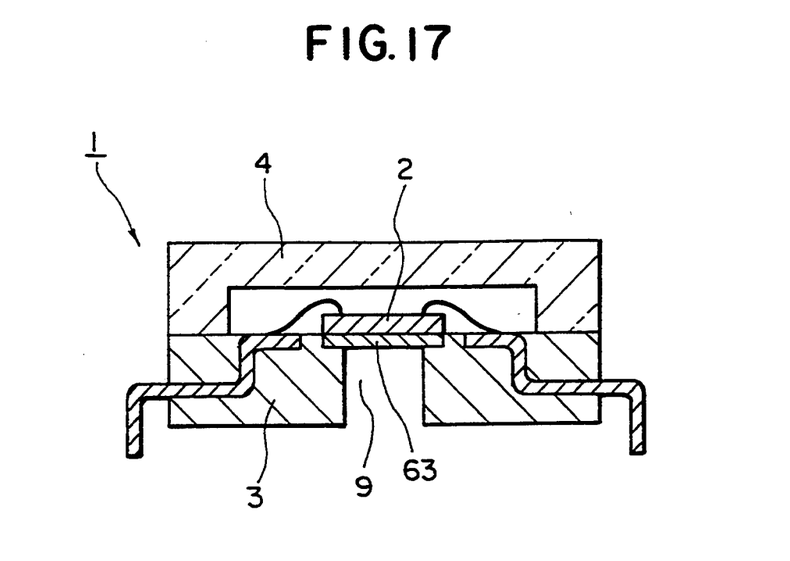
FIG. 17 is a cross-sectional view of a still further CCD image sensor.

FIG. 17 illustrates a still further CCD image sensor 1 which also has the die pad 63 in the mount area of a base 3. The base 3 has a heat-radiating hole 9 defined therein and exposing the portion of the reverse side of the die pad 63 which corresponds to at most an active-element region of the CCD chip 2. Heat generated by the CCD chip 2 can be radiated out through the metallic die pad 63.

Figure 18:
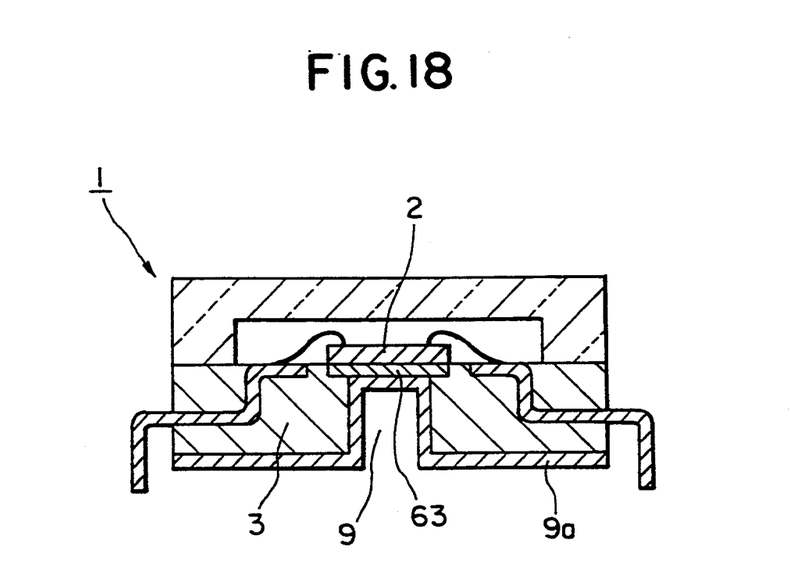
FIG. 18 is a cross-sectional view of the CCD image sensor shown in FIG. 17 with a heat-radiating cap mounted.

In FIG. 18, the CCD image sensor 1 shown in FIG. 17 is combined with a heat-radiating cap 9a attached to the lower surface of the base 3 by an electrically conductive adhesive. The heat-radiating cap 9a has a portion held in contact with the reverse side of the die pad 63 for increasing the heat radiation capability and reducing any ground potential variations on the CCD chip 2.

Since the base 3 is made of resin, it can easily be molded using a corresponding mold cavity even though the base 3 is of a complex configuration.

In the case where the mount area 8 of the base 3 for supporting the CCD chip 2 and the joint surfaces of the cover 4 are of a stain finish, the silver paste, the resin sealer, and the ultraviolet-curing adhesive can be applied thereto for greater bonding strength.

Figure 19:
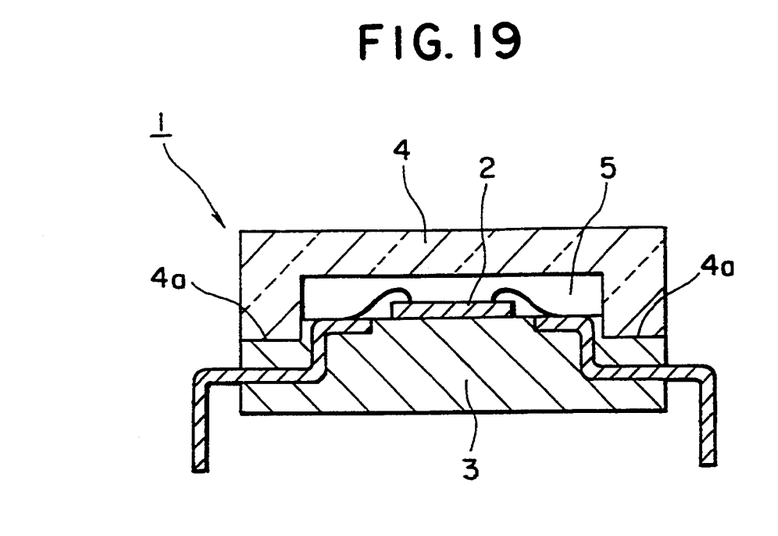
FIG. 19 is a cross-sectional view of another CCD image sensor.

FIG. 19 shows another CCD image sensor 1 having a base 3 including joint surfaces 4a to be joined to a cover 4, the joint surfaces 4a being lower than the other upper surface of the base 3. The cover 4 can accurately be positioned with respect to the base 3 when the cover 4 is aligned with respect to the joint surfaces 4a.

Figure 20:
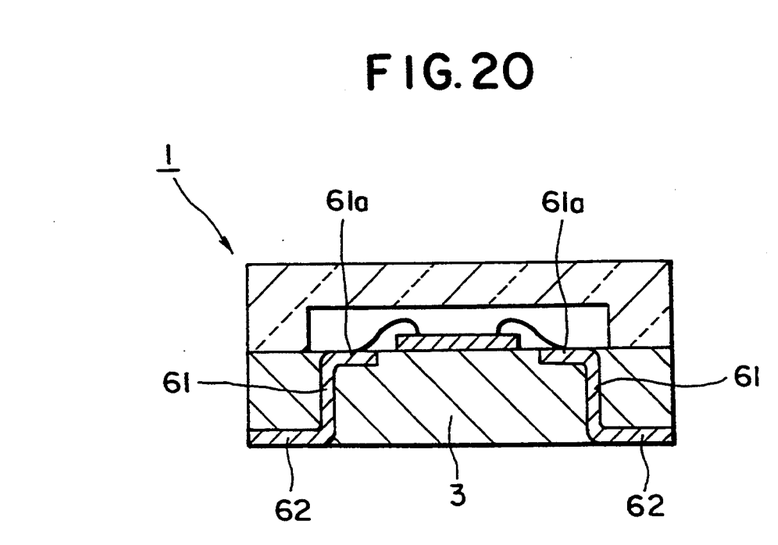
FIG. 20 is a cross-sectional view of still another CCD image/sensor.

FIG. 20 shows still another CCD image sensor 1 including outer leads 62 extending from inner leads 61 and attached to the reverse side of a base 3. To form the base 3, the joints 61a of the inner leads 61 are held against the inner surface of the upper mold 31 shown in FIG. 4, and the outer leads 62 are held against the inner surface of the lower mold 32. Then, the cavity 30 is filled with a molding resin material. When the base 3 is thus molded, the outer leads 62 are exposed on the lower surface of the base 3.

Figure 21:
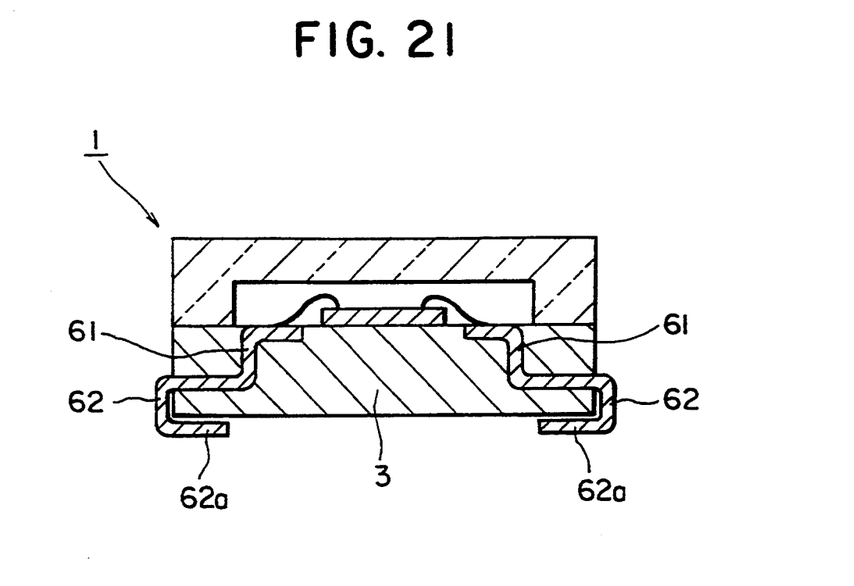
FIG. 21 is a cross-sectional view of yet another CCD image sensor.

FIG. 21 illustrates yet another CCD image sensor 1 which has outer leads 62 extending from the sides of a base 3. The outer leads 62 are bent downwardly and have distal ends 62a bent over the reverse side of the base 3. The CCD image sensor 1 with the outer leads 62 lying over the reverse side of the base 3 lends itself to being surface-mounted on a printed-wiring board or the like.

Figure 22:
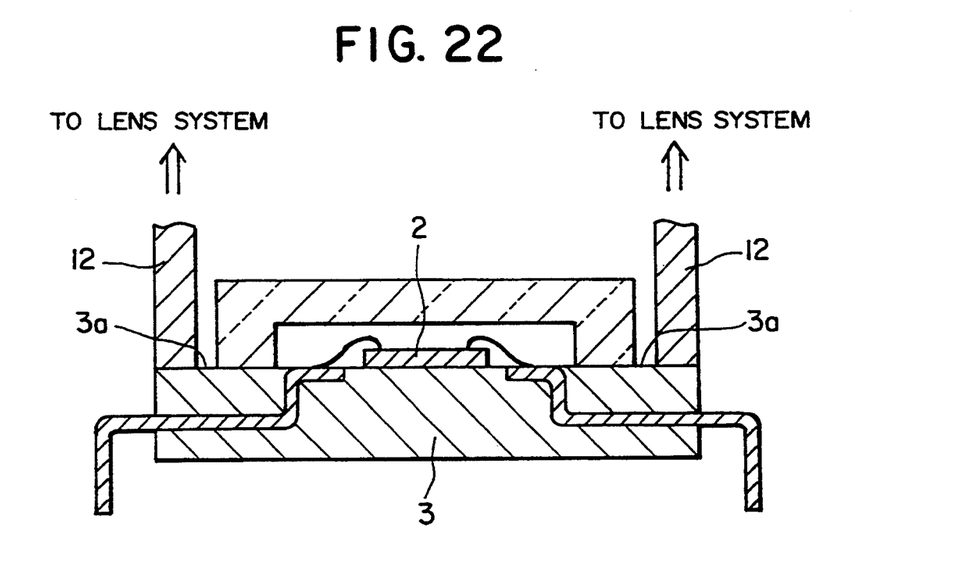
FIG. 22 is a cross-sectional view of yet still another CCD image sensor.

FIG. 22 shows still another CCD image sensor 1 having a base 3 including outer surfaces 3a disposed around a cover 4 mounted on the base 3. A holder base 12 of a lens system is joined to the outer surfaces 3a of the base 3. The holder base 12 is mounted on the base 3 with reference to the upper surface of the base 3 which is finished with high accuracy. The arrangement shown in FIG. 22 is effective to increase the swing and tilt accuracy and back-focus accuracy of the lens system with respect to the CCD image sensor 1 with the CCD chip 2.

The CCD image sensor 1 with the hollow package according to the present invention and the method of manufacturing the CCD image sensor 1 offer the following advantages:

Since the base 3 is made of a resin material, the leads 6 can be embedded in the base 3. As the joint surfaces of the base 3 and the cover 4 are made flat, the space defined between the base 3 and the cover 4 remains highly sealed, making the CCD image sensor 1 highly resistant to moisture.

The heat-radiating hole 9 defined in the base 3 below the mount area 8 for the CCD chip 2 allows the CCD image sensor 1 to radiate heat well even though the base 3 is made of a resin material.

Consequently, the CCD image sensor 1 is highly reliable in operation.

The outer leads 6 disposed on the reverse side of the base 3 makes it possible to surface-mount the CCD image sensor 1.

Inasmuch as the upper surface of the base 3 is rendered flat highly accurately, a lens system combined with the CCD image sensor 1 can accurately be positioned with respect to the CCD chip 2 with reference to the upper surface of the base 3.

The CCD image sensor 1 with the hollow package is thus highly accurate and can be manufactured inexpensively.

According to the manufacturing method, the CCD image sensor 1 of small size and light weight can be manufactured since the base 3 and the cover 4 are molded of a resin material.

If the base 3 and the cover 4 are made of thermoplastic resin, then they can quickly be joined to each other by the ultrasonic or laser fusion process.

If the base 3 and the cover 4 are made of either thermosetting resin or thermoplastic resin, then they can easily be joined to each other by an ultraviolet-curing adhesive.

Since the base 3 and the cover 4 are not required to be bonded with heat, the lead frame 10 may be electroplated with tin, solder, or the like in advance.

The cost of the CCD image sensor 1 may be reduced as the number of steps of the electroplating process may greatly be reduced.

Irrespective of whether thermosetting resin or thermoplastic resin is employed, the difference between the coefficients of thermal expansion of the base 3 and the cover 4 is almost eliminated. This, together with the fact that the base 3 and the cover 4 are not required to be heated in their entirety, makes it possible to manufacture the CCD image sensor 1 which is free of the danger of peeling off due to heat-induced deformation, is highly hermetic, and of high quality.

Therefore, small and lightweight CCD image sensors 1 can be mass-produced.

What is claimed is:

1. A charge-coupled image sensor comprising:
a base of a resin having a mount area on an upper surface with a charge-coupled device chip connected to said mount area;
leads mounted on said base and connected to said charge-coupled device chip through bonding wires; and
a cover of resin joined to the upper surface of said base and having a downwardly open recess housing said charge-coupled device chip and said bonding wires;
said leads including respective inner leads having respective joints connected to said bonding wires, said inner leads having portions, except said joints, embedded in said base, and respective outer leads extending from said inner leads and
wherein said mount area is of a convex shape higher than the upper surface of said base.

2. A charge-coupled image sensor comprising:
a base, of a resin having a mount area on an upper surface with a charge-coupled device chip connected to said mount area;
leads mounted on said base and connected to said charge-coupled device chip through bonding wires; and
a cover of resin joined to the upper surface of said base and having a downwardly open recess housing said charge-coupled device chip and said bonding wires;
said leads including respective inner leads having respective joints connected to said bonding wires, said inner leads having portions, except said joints, embedded in said base, and respective outer leads extending from said inner leads and
wherein said mount area is of a concave shape lower than the upper surface of said base.

3. A charge-coupled image sensor comprising:
a base of a resin having a mount area on an upper surface with a charge-coupled device chip connected to said mount area;
leads mounted on said base and connected to said charge-coupled device chip through bonding wires; and
a cover of resin joined to the upper surface of said base and having a downwardly open recess housing said charge-coupled device chip and said bonding wires;
said leads including respective inner leads having respective joints connected to said bonding wires, said inner leads having portions, except said joints, embedded in said base, and respective outer leads extending from said inner leads and
wherein said base has a thickness below said mount area which is smaller than the thickness of the remainder of the base.

4. A charge-coupled image sensor comprising:
a base, of a resin having a mount area on an upper surface with a charge-coupled device chip connected to said mount area;
leads mounted on said base and connected to said charge-coupled device chip through bonding wires; and
a cover of resin joined to the upper surface of said base and having a downwardly open recess housing said charge-coupled device chip and said bonding wires;
said leads including respective inner leads having respective joints connected to said bonding wires, said inner leads having portions, except said joints, embedded in said base, and respective outer leads extending from said inner leads and further including a metallic die pad mounted on the mount area and
wherein said
base has a thickness below said die pad which is smaller than the thickness of the remainder of the base.

5. A charge-coupled image sensor comprising:
a base of a resin having a mount area on an upper surface with a charge-coupled device chip connected to said mount area;
leads mounted on said base and connected to said charge-coupled device chip through bonding wires; and
a cover of resin joined to the upper surface of said base and having a downwardly open recess housing said charge-coupled device chip and said bonding wires;
said leads including respective inner leads having respective joints connected to said bonding wires, said inner leads having portions, except said joints, embedded in said base, and respective outer leads extending from said inner leads and further including a metallic die pad mounted on the mount area and
wherein said base has a heat-radiating hole defined therein below said die pad and exposing a reverse side of the die pad.

6. A charge-coupled image sensor comprising:
a base of a resin having a mount area on an upper surface with a charge-coupled device chip connected to said mount area;
leads mounted on said base and connected to said charge-coupled device chip through bonding wires; and
a cover of resin joined to the upper surface of said base and having a downwardly open recess housing said charge-coupled device chip and said bonding wires;
said leads including respective inner leads having respective joints connected to said bonding wires, said inner leads having portions, except said joints, embedded in said base, and respective outer leads extending from said inner leads and
wherein said base has a joint surface connected to said cover, said joint surface being lower than the upper surface of the remainder of said base.

7. A charge-coupled image sensor comprising:
a base of a resin having a mount area on an upper surface with a charge-coupled device chip connected to said mount area;
leads mounted on said base and connected to said charge-coupled device chip through bonding wires; and
a cover of resin joined to the upper surface of said base and having a downwardly open recess housing said charge-coupled device chip and said bonding wires;
said Leads including respective inner leads having respective joints connected to said bonding wires, said inner leads having portions, except said joints, embedded in said base, and respective outer leads extending from said inner leads and
wherein said outer leads are disposed over a reverse side of said base.

8. A charge-coupled image sensor comprising:
a base of a resin having a mount area on an upper surface with a charge-coupled device chip connected to said mount area;
leads mounted on said base and connected to said charge-coupled device chip through bonding wires; and
a cover of resin joined to the upper surface of said base and having a downwardly open recess housing said charge-coupled device chip and said bonding wires;
said leads including respective inner leads having respective joints connected to said bonding wires, said inner leads having portions, except said joints, embedded in said base, and respective outer leads extending from said inner leads and
further including a holder base for an optical lens system, said holder base being mounted on said base outside of said cover with reference to the upper surface of the base.

* * * * *